(12) United States Patent
Belloul et al.

(10) Patent No.: US 11,229,136 B2
(45) Date of Patent: Jan. 18, 2022

(54) ENCLOSURE COVER WITH AN ANTENNA

(71) Applicant: Freshwave Services Limited, East Grinstead (GB)

(72) Inventors: Bachir Belloul, East Grinstead (GB); Ravi Mondair, East Grinstead (GB)

(73) Assignee: Freshwave Services Limited, East Grinstead (GB)

( * ) Notice: Subject to any disclaimer, the term of this patent is extended or adjusted under 35 U.S.C. 154(b) by 158 days.

(21) Appl. No.: 16/455,572

(22) Filed: Jun. 27, 2019

(65) Prior Publication Data

US 2020/0008311 A1 Jan. 2, 2020

(30) Foreign Application Priority Data

Jun. 27, 2018 (GB) ...................................... 1810549

(51) Int. Cl.
| | | |
|---|---|---|
| *H05K 5/00* | (2006.01) | |
| *H05K 5/06* | (2006.01) | |
| *H01Q 1/00* | (2006.01) | |
| *H01Q 1/42* | (2006.01) | |
| *H05K 5/02* | (2006.01) | |

(52) U.S. Cl.
CPC .............. *H05K 5/06* (2013.01); *H01Q 1/002* (2013.01); *H01Q 1/42* (2013.01); *H05K 5/02* (2013.01)

(58) Field of Classification Search
CPC ............ H05K 5/06; H05K 5/02; H01Q 1/002; H01Q 1/42
See application file for complete search history.

(56) References Cited

U.S. PATENT DOCUMENTS

| | | |
|---|---|---|
| 2011/0077036 A1 | 3/2011 | Frank et al. |
| 2019/0226874 A1* | 7/2019 | Slater ........................ H04Q 9/00 |
| 2019/0260412 A1* | 8/2019 | Zhao ..................... H01Q 1/2291 |
| 2020/0025811 A1* | 1/2020 | Gizelar ..................... H02B 1/46 |
| 2020/0036077 A1* | 1/2020 | Schlosser ............. H01Q 1/1207 |

FOREIGN PATENT DOCUMENTS

| | | | |
|---|---|---|---|
| CN | 201307166 | | 9/2009 |
| CN | 202168102 | | 3/2012 |
| CN | 203200786 U | * | 9/2013 |
| CN | 106802592 | | 6/2017 |
| CN | 107059930 | | 8/2017 |
| CN | 107059931 | | 8/2017 |
| JP | 2004-364436 | | 12/2004 |
| JP | 2015-10403 | | 1/2015 |
| KR | 10-1394071 | | 5/2014 |
| WO | WO 2018/094555 | | 5/2018 |

* cited by examiner

*Primary Examiner* — Dieu Hien T Duong
(74) *Attorney, Agent, or Firm* — Levy & Grandinetti

(57) ABSTRACT

A cover for a sunken enclosure includes a mounting part for mounting it to a sunken enclosure with which it is used such that the cover is movable between a closed position in which it closes an open top of the enclosure and is substantially level with a surface intersected by the open top, and an open position in which it is displaced from the surface and exposes an internal area of the enclosure, and in which the cover includes an antenna for transmitting and receiving radio waves.

14 Claims, 5 Drawing Sheets

ENCLOSURE COVER WITH AN ANTENNA

The present invention relates to an enclosure cover with an antenna, for use particularly, but not exclusively, as a retro-fit cover for street level communications lines inspection chambers.

Wireless communication has become an integral part of everyday life, and is projected to play an even bigger role thanks to the rapid evolution in mobile communication technologies. As a result large chunks of the radio spectrum are being diverted by regulatory authorities across the world to support future mobile communications. In particular, the imminent arrival of 5G technology will see a significant increase in the number of connected devices, including those termed the Internet of Things, as well as machine to machine communications, autonomous vehicles, smart motorways and so on. The communications infrastructure required to support this growth in connectivity and capacity is expected to increase exponentially.

urban environments in particular, where the density of connected objects and devices will be very high, it is important for mobile operators and WiFi (RTM) service providers to mount communications equipment for both voice and data services as close as possible to mobile users. Currently communication infrastructure is commonly installed on street furniture assets, such as street lighting columns, telephone boxes, bus shelters and so on. However, this approach has a number of issues when it comes to network roll out. Firstly, there is a limited supply of viable street assets. This is particularly the case when highways or local authorities remove such street furniture from high footfall areas as part of a decluttering exercise. Secondly, the requirement to satisfy planning rules concerning aesthetics can make it difficult or impossible to mount communications infrastructure in elevated visible positions in certain locations. This is particularly the case in conservation areas, or when street assets are listed. Thirdly, the load bearing capacity of the structure may be compromised when installing additional equipment, which can necessitate costly upgrades. Finally fibre cabling is crucial for all communications infrastructure, and often it is not readily available n the vicinity of common street assets. Construction work is therefore required to extend the fibre footprint.

Collectively, these four issues significantly limit the availability of suitable assets to house communication network infrastrucutre. This could potentially be a major barrier to the expansion of capacity for voice and data services on cellular mobile and WiFi networks in external ultra-dense urban areas.

In addition, when parts of cities are regenerated, or new parts created, there can be a surge in the number of locals, commuters and visitors in a particular area, meaning that mobile network operators have to adapt to the shifting capacity-requirement landscape. The difficulty and delays associated with obtaining planning permissions, as well as high rental costs and limited opportunities to deploy infrastructure, renders this exercise even more challenging for the operators.

The present invention is intended to overcome some of the above described problems, by utilising below ground chambers (or sunken enclosures) to house communications infrastructure.

Therefore, according to the first aspect of the present invention a cover for a sunken enclosure is provided, in which said cover comprises a mounting part for mounting it to a sunken enclosure with which it is used such that said cover is movable between a closed position in which it closes an open top of said enclosure and is substantially level with a surface intersected by said open top, and an open position in which it is displaced from said surface and exposes an internal area of said enclosure, and in which said cover comprises an antenna for transmitting and receiving radio waves.

Thus, the present invention seeks to address the issue of increased requirement for access to communications networks by providing connection points inside street level inspection chamber covers. Such covers are ubiquitous in urban environments and currently perform no function other than closing and protecting all the various kinds of sunken enclosures, such as man-holes and the various utilities access and inspection chambers. The covers of particular interest in this case are those used to cover power and communication line inspection chambers, because the antenna can then be directly connected to the communications network in question which runs through the chamber. In addition, power to drive the antenna can also be taken. As such, the cover of the invention can serve as an underground antenna and base station site to provide localised coverage and capacity to complement the existing coverage provided by the mobile network operators and other service providers.

It will be appreciated though that the invention is not limited to such application, and can also be used with any kind of cover for a sunken enclosure, which could include a comms box sunken into a floor inside a building such an office block or a transport hub. Such sunken floor enclosures are widely known, and also commonly provide direct access to communications and power lines of an existing communications infrastructure.

The manner in which the antenna is incorporated into the cover can be any known kind of structure. For example, it could simply be attached to an internal side of the cover. However, in a preferred construction the cover can comprise an internal chamber, and the antenna can be mounted in the internal chamber.

The antenna can be stand-alone antenna, meaning it is a standard model of antenna purchased as is from an antenna manufacturer and then mounted in the internal chamber, or it can be a bespoke item constructed specifically for use with the cover. The antenna can also have any known antenna shape, such as a simple rod, or a U-shape, or anything more complex, such as a lattice or matrix shape. It can also be three dimensional and extend in multiple planes, provided it remains a component of the cover. Which approach is taken with the antenna will depend on cost, performance and customer choice. It will be appreciated than a bespoke antenna could be designed which might improve the radiation distribution of the emitted signal by maximising the available apace in the chamber, but this will be more expensive to manufacture. An off-the-shelf antenna, or one which a communications network customer already uses, might be preferred.

Any radio frequency antenna will have given radiation distribution characteristics. For example it can be omnidirectional, so the radio frequency signal is distributed in all directions at once, or it can be shaped to be directional so the radio frequency signal is distributed in a particular direction, and/or has a particular distribution shape in a given area around it. The present invention will work with any kind of antenna, because all known types will emit a signal with sufficient strength and distribution to be able to connect to a mobile device in its vicinity. However, it will be appreciated that the antenna will operate according to its radiation distribution characteristics, which may result in greater or lesser performance depending on what those characteristics are. It will be appreciated that this performance will also be affected by the surrounding urban environment, which might include static objects such as buildings, street furniture and trees and so on, as well as moving objects such as passing vehicles and people. The present invention is not directed towards honing the performance of the antenna, and that can be a matter for the person skilled in the art who is developing or manufacturing the cover, as well as for the person fitting the cover in practice. Any new and inventive antennas for use with a cover of the first aspect of the invention can be the subject of further patent applications.

It will be appreciated that if the cover is made from a material which is entirely impenetrable to radio waves then the invention will not work. The invention may still work if the main body of the cover is partially transparent to radio waves, for example it some parts of it are made from a metal and others from a plastics material. However, in a preferred construction the cover can comprise a metal outer frame, to which can be mounted an upper panel and a lower panel which define the internal chamber between them. At least the upper panel can be transparent to radio waves. The metal outer frame can be a simple square shape, which provides structural rigidity to the cover, and which also provides a large central area for radio waves to travel through. The upper panel and lower panel can be constructed from a hard-wearing plastics material like PTFE, HDPE or UHMWPE, or from a glass reinforced material such as GRP or GRC.

In one version of the invention the cover can comprise radio frequency reflector plates which are shaped and/or positioned such that when the cover is in the closed position they direct portions of the radio wave signals transmitted by the antenna in directions towards the internal area back out of the top of the enclosure and into an area beyond the enclosure where the antenna is intended to provide signals to. As discussed above, the type of antenna which is used is a matter for the skilled person. Likewise, the shape and/or position of the reflector plates can also be a matter for the skilled person, in particular in the way such reflector plates direct portions of the emitted radio frequency signal which are not heading directly out of the enclosure, back out of the enclosure. The size, position and angle of such reflector plates will produce particular results, and it will be appreciated how this can be adjusted to achieve better results in one or more ways. It will also be appreciated how such plates could be adjusted on site to improve the overall radiation pattern of the antenna in relation to its surroundings. Once again, the present invention is not directed towards honing the performance of the reflector plates, and that can be a matter for the person skilled in the art who is developing or manufacturing the cover, as well as for the person fitting the cover in practice. Any new and inventive reflector plates for use with a cover of the first aspect of the invention can be the subject of further patent applications.

The manner in which the cover mounts to the sunken enclosure with which it is used can be any of the known ways in which existing inspection chamber covers are mounted. In one version of the invention the mounting part can comprise a flange for mounting on a ledge provided in the enclosure. In other words, the cover can be completely removable from the enclosure by simply being lifted from the ledge.

However preferably, the mounting part can comprise the first part of a hinge for mounting to a second part of the hinge provided as a part of the enclosure, and the cover can rotate about a hinge axis when it moves between the closed position and the open position. This is how some existing inspection chamber covers operate. It is advantageous for the present invention because the cover may be an expensive component and fixing it to the enclosure makes it more secure. It also makes it easier to lead cabling from the enclosure to the cover. The first part of the hinge can be supported by the metal frame part of the cover.

It will be appreciated than an antenna requires a number of other electrical components to transmit and receive radio waves. Therefore the cover can comprise further power and/or communications devices being one or more of a programmed control chip, an RF transmitter, a power connector, a power supply, a communication line connector, an in-line data communication converter and a communications data to RF converter. It is widely known how such electrical components function to drive an antenna and to transmit and receive multiple communications signals, and the present invention is not concerned with that aspect. The relevant feature here is that some or all of these components can be incorporated into the cover as desired. The skilled person can determine what is needed in each case, which may be determined by exactly what is already located inside the communications network inspection chambers to which the cover is to be mounted. In some cases some of these electrical components may already be present, in which case they are not required. In other cases some of these electrical components may not already be present but might be better disposed inside the enclosure anyway, in which case they are not incorporated into the cover but are provided for fitment separately.

The further power and/or communications devices can be incorporated into the cover in any possible way, for example they could be located within the internal chamber. However, such electrical componentry is fairly large, so in a preferred construction the lower panel can comprise the first part of an attachment mechanism on an external side thereof, and the further power and/or communications devices can be attached to the lower panel by the second part of the attachment mechanism. This could be something as simple as screws or nuts and colts. However, in a preferred construction the first part of the connection mechanism can comprise a plurality of tracks formed in the external side of the lower panel, and the second part of the connection mechanism can comprise a plurality of fixings which can be secured in the tracks at suitable locations. Such an attachment mechanism is generally known, and is advantageous because it allows for components to be moved to suitable locations on the cover as required.

Whatever electrical componentry is present as part of the cover, be it just the antenna or other electrical components as referred to above, they will need to be connected to power and/or communications inputs from within the enclosure. Therefore, the cover can comprise a power and/or communications connector for connecting one or more of the antenna, the programmed control chip, the RF transmitter, the power connector, the power supply, the communication line connector and the communications data to RF converter to power and/or communications equipment with which the cover is used and which is disposed in the enclosure. In versions of the invention in which the cover is simply removable from the enclosure, this connector can be in any location, and will simply need to be disconnected when the cover is removed. However, in versions of the invention in which the cover is hinged to the enclosure, the connector can be located in the vicinity of the hinge axis, so when the cover is rotated into the open position it does not need to be disconnected.

The cover can comprise one or more physical parameter sensors being one or more of temperature, humidity, motion detection, electrical fault, water ingress, pressure, footfall counter, GPS antenna and RFID tag sensors. With this arrangement data about the operational status of the cover can be collected and transmitted to a remote monitoring and diagnostics function. In the event of such data indicating an undesired physical situation or other fault being received, remedial action can be taken. This could include data indicating that the cover is in the open position when it should not be, that the cover has collapsed into the enclosure, that the cover is flooded, or that the temperature in the cover is too high or too low. Physical parameter sensors of this kind are well known, and their choice of design and manner of implementation in the present invention is a matter for the person skilled in the art.

The cover can comprise a locking part for locking the cover in the closed position. Such cover locks are also known, but in this instance the lock is of particular importance because of the potentially valuable electronic equipment housed in the cover. Conveniently, the locking part can be supported by the metal frame, to make it more secure.

The upper panel can comprise anti-slip formations on an external side thereof, so as to prevent slippage by those passing over it. Such formations can also add a degree of structural rigidity to the upper panel.

The upper panel can comprise a handle on an external side thereof which can be moveable between a flush position in which it is level with a plane of the external side of the upper panel, and a raised position in which it is usable to manipulate the cover. This allows a user to move the cover into the open position more easily. The cover can also comprise access apertures to allow it to be manipulated into the open position by the use of lifting rods. Such lifting rods are known in the art and are commonly used to open and close inspection chambers.

Preferably the cover can comprise a seal member around a periphery thereof which engages a rim of the open top in the closed position to fluidly seal said internal area. This helps to prevent ingress of environmental factors which might damage the antenna or other electrical components in the cover.

The further power and/or communications devices will generate heat when in use, so the cover can comprise heatsink apparatus to dissipate heat generated by the further power and/or communications devices in use.

The heatsink can be any known kind, including those which are simply mounted to a PCB. However, due to the amount of heat likely to be generated, and the fact that the enclosure is an enclosed space without any real means of ventilation or cooling, in a preferred construction the heatsink apparatus can comprise a closed loop fluid heat exchange system comprising one or more heat exchangers arranged in the vicinity of the further power and/or communications devices, pipework in thermal communication with the metal frame, and a fluid pump for pumping fluid through the heat exchangers and through the pipework. Therefore, the heatsink apparatus employs the metal frame of the cover as a heatsink component thereof. As this is will be mounted to a metal upper frame part of the enclosure, the heat generated in use can be transmitted to this metal upper frame part, and then into the ground.

It will be appreciated that while the main focus of the present invention is the cover itself, as this is the intended final product, it is also be possible to implement the invention by manufacturing entire enclosures for sinking into the ground which feature a cover like that described above. These might be manufactured off-site for placing in a hole, or they might be manufactured on site inside such a hole by an installation engineer. Such enclosures could be intended to function as inspection chambers which have power and/or communications lines running through them. However, alternatively such enclosures could be intended to be stand-alone antenna base stations. In particular, this might be appropriate in instances in which it is desired to connect a cover like that described above to ground laid power and/or communications lines passing through a particular existing inspection chamber, but for some reason it is not possible to fit a cover like that described above to that inspection chamber. This might happen if the inspection chamber lacks sufficient space to accommodate the antenna or other components. Therefore, a solution here is to provide an enclosure as mentioned above, and fit it adjacent to the existing inspection chamber. As such, the enclosure may have no real purpose other than to support the cover and any of the further power and/or communications devices not mounted on the cover.

Therefore, according to a second aspect of the present invention an enclosure for mounting in a surface in a sunken arrangement is provided, comprising an internal area, an open top and a cover, in which said cover is movable between a closed position in which it closes said open top and is substantially level with said surface, and an open position in which it is displaced from said surface and exposes said internal area, and in which said cover comprises an antenna for transmitting and receiving radio waves.

As mentioned above, the enclosure can comprise further power and/or communications devices being one or more of a programmed control chip, an RF transmitter, a power connector, a power supply, a communication line connector, an in-line data communication converter and a communications data to RF converter. Some or all of these can still be mounted to the cover, or some or all of them can be mounted in the internal area, which might be more convenient. The enclosure can comprises a heat sink apparatus to dissipate heat generated by the further power and/or communications devices in use.

In particular the heat sink apparatus comprise a closed loop fluid heat exchange system comprising one or more heat exchangers arranged in the vicinity of the further power and/or communications devices, a cold plate mounted to an external side of the enclosure, and a fluid pump for pumping fluid through the heat exchangers and into thermal communication with the cold plate. Therefore, the cold plate can transmit heat directly into the ground.

The enclosure can comprise other convenient features, such as a metal upper frame part to which the cover can be hinged. It can also comprise a plurality of openings through which power and/or communications lines can be passed, which extend from an adjacent existing inspection chamber.

The present invention can be performed in various ways, but three embodiments will now be described by way of example, and with reference to the accompanying drawings, in which:

FIG. 5 is a cross-sectional side view of the cover shown in FIG. 1 in an in-use position;

Figure 1:
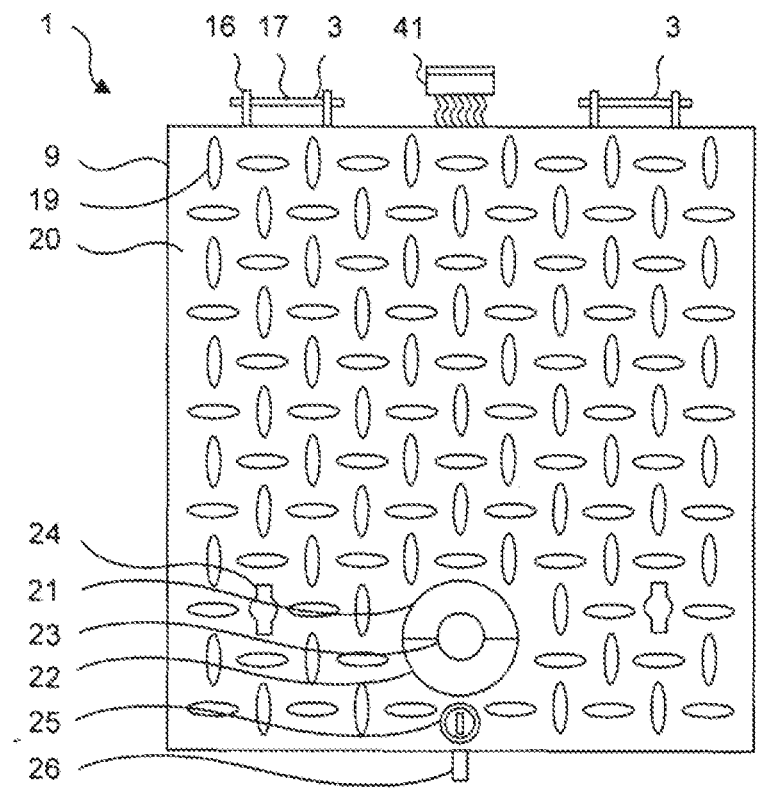
FIG. 1 is a view of a cover according to the first aspect of the present invention.

As shown in FIGS. 1 to 5 a cover 1 for a sunken enclosure, in the form of inspection chamber 2, comprises a mounting part, in the form of first parts of hinges 3, for mounting it to the inspection chamber 2 with which it is used, such that the cover 1 is movable between a closed position in which it closes an open top 4 of the inspection chamber 2 and is substantially level with a surface, in the form of the ground 5, which is intersected by the open top 4, and an open position, as shown in FIG. 5, in which it is displaced from the ground 5 and exposes an internal area 6 of the inspection chamber 2, and in which the cover 1 comprises an antenna 7 for transmitting and receiving radio waves.

The cover 1 comprises a rectangular metal box frame 8, an upper panel 9 and a lower panel 10. The upper panel 9 comprises downwardly depending walls 11, so the upper panel 9 and lower panel 10 define an internal chamber 12 between them, in which the antenna 7 is mounted. The upper panel 9 is also slightly larger than the outer dimensions of the box frame 8, such that a flange 13 is formed around an upper edge 14 of the cover 1.

The first parts of hinges 3 extend from a rear section 15 of the box frame 8, and each comprise pairs of brackets 16 with a spindle 17. The first parts of hinges 3 are designed to co-operate with second parts of hinges 18 provided as a part of the inspection chamber 2, as described further below.

The upper panel 9 has anti-slip formations 19 on an external side 20 thereof. These are designed to prevent slippage by those passing over it. It also comprises a semi-circular handle 21 on the external side 20. This is disposed in a seat 22 and is rotatable about a spindle (not visible) passing through boss 23, between a flush position, as shown in FIG. 1, in which it is level with a plane of the external side 20, and a raised position, as shown in FIG. 5, in which is usable to manipulate the cover 1. Further, the cover 1 also comprises two access apertures 24 to allow it to be manipulated into the open position by the use of lifting rods (not shown). Such lifting rods are known in the art and are commonly used to open and close inspection chamber covers.

The cover 1 also comprises a key-operated barrel lock 25, which rotationally controls a locking arm 26. The locking arm 26 can be arranged in an extended position as shown in FIG. 1, in which it can engage with a socket (not visible) provided in a metal upper frame part 27 of the inspection chamber 2, to lock the cover 1 in the closed position. Using the key (not shown), the locking arm 26 can be rotated into a withdrawn position allowing the cover 1 to be released from the inspection chamber 2 and rotated into the open position as shown in FIG. 5.

Figure 6:
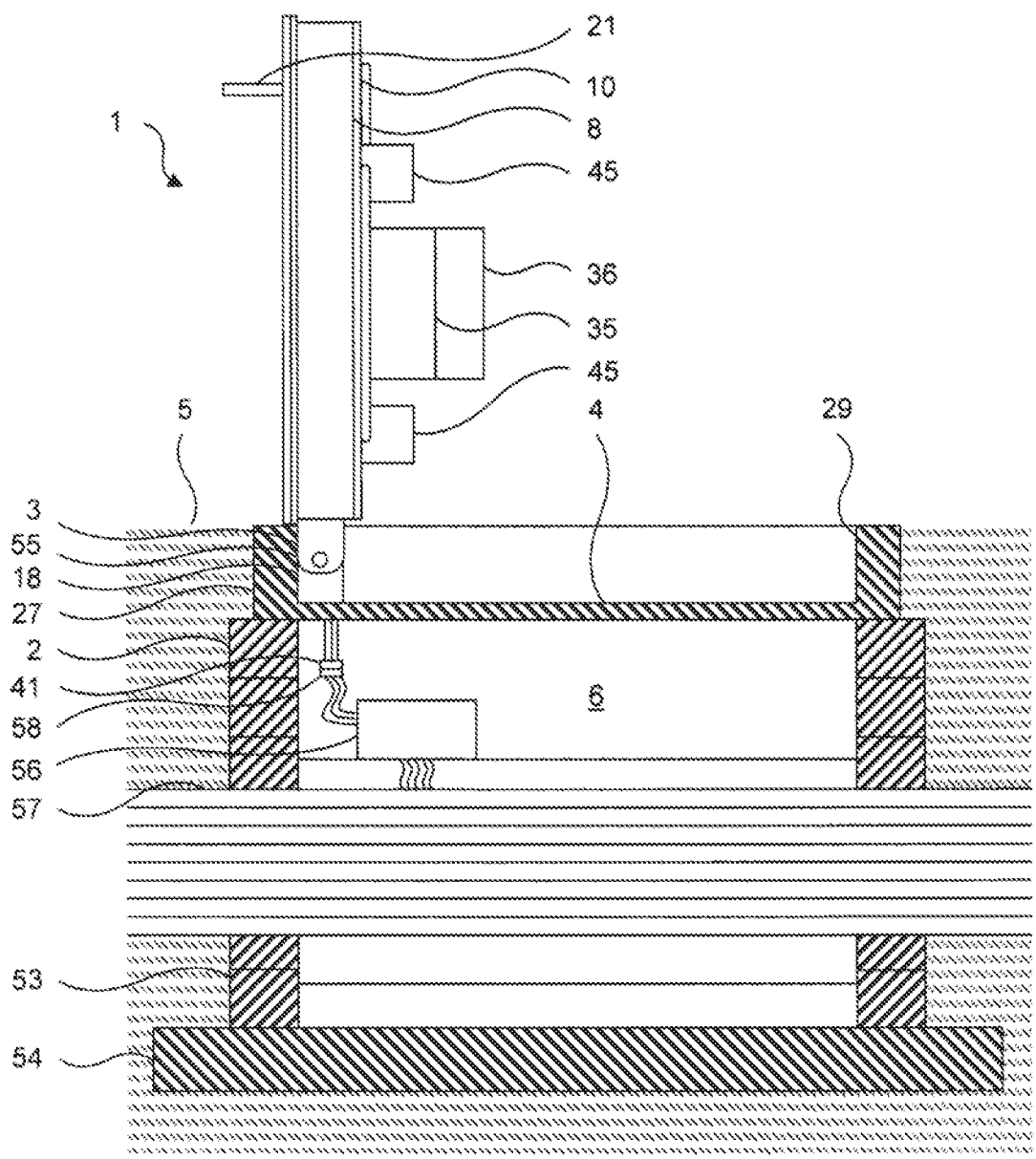
FIG. 6 is a cross-sectional side view of a first enclosure according to the second aspect of the present invention.
Figure 6:
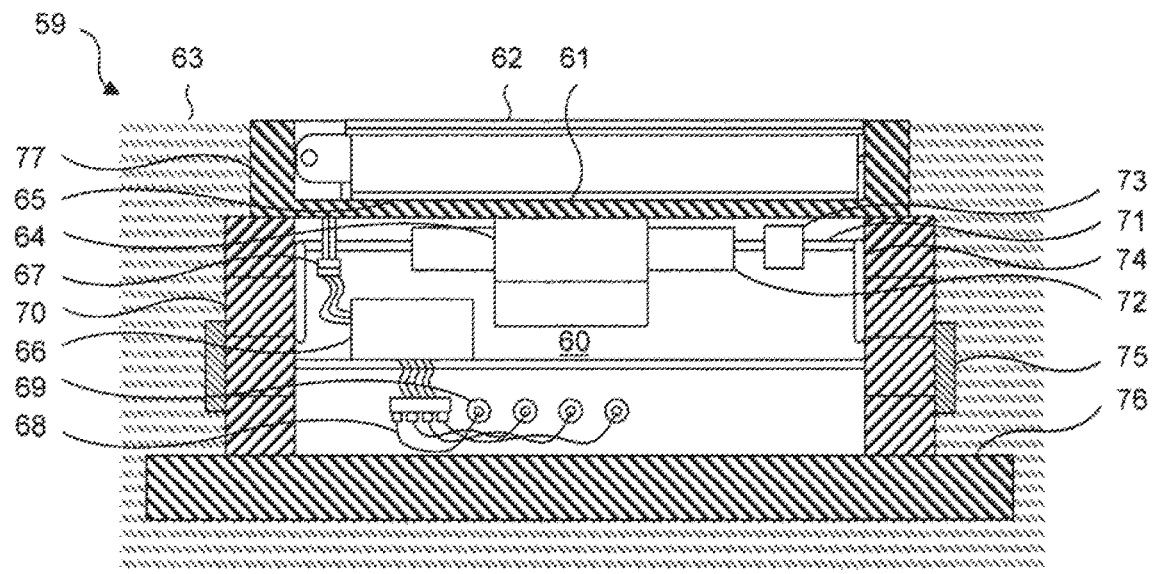
Figure 7:
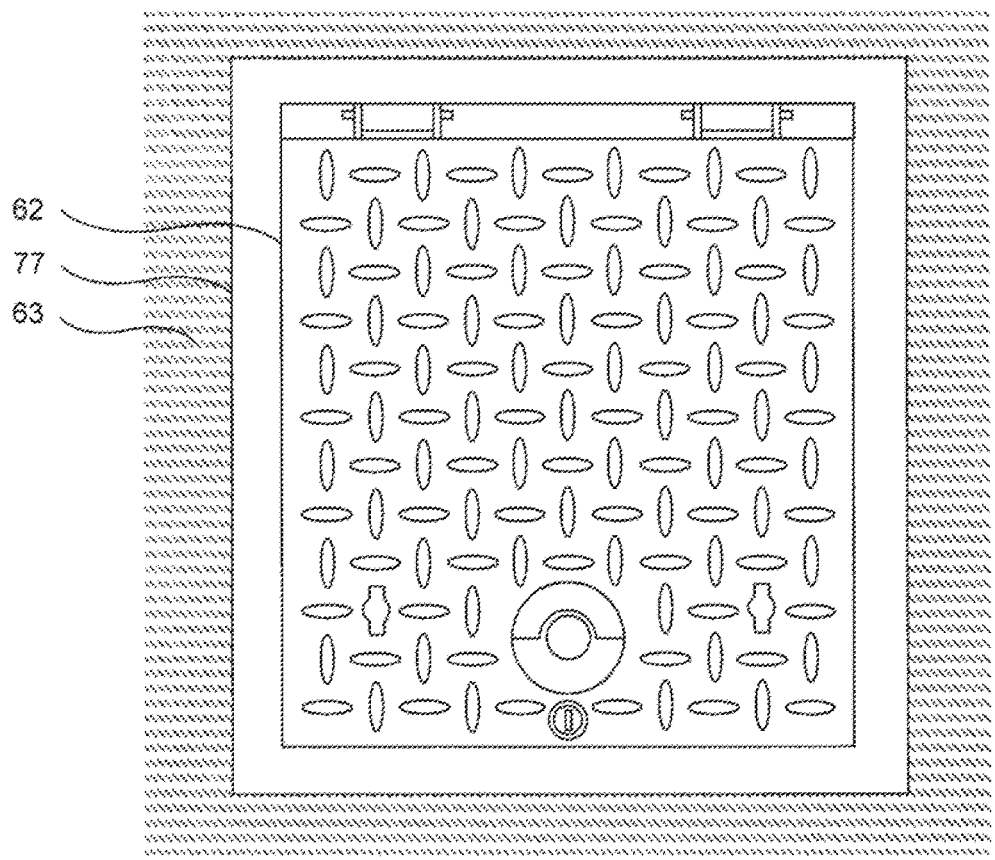
FIG. 7 is a top view of the enclosure as shown FIG. 6.

The cover also comprises a seal member 28 just under the flange 13, which extends around the box frame 8. This engages a rim 29 of metal upper frame part 27 of the inspection chamber 2 when the cover 1 is in the closed position, in order to fluidly seal internal area 6. (This is not demonstrated in FIG. 5, but it is shown in FIG. 6 where similar cover 62 engages the metal upper frame part 77 of enclosure 59.) This helps to prevent ingress of environmental factors which might damage the antenna 7 or other electrical components in the cover 1.

Figure 2:
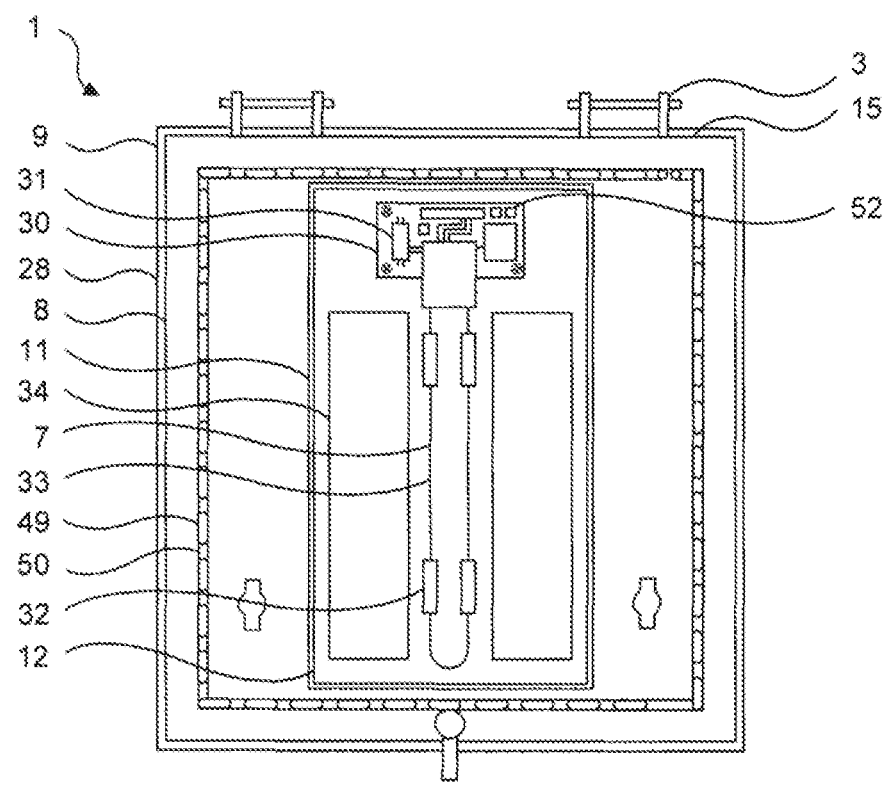
FIG. 2 is an underside view of the cover shown in FIG. 1 without a lower panel part thereof.
Figure 3:
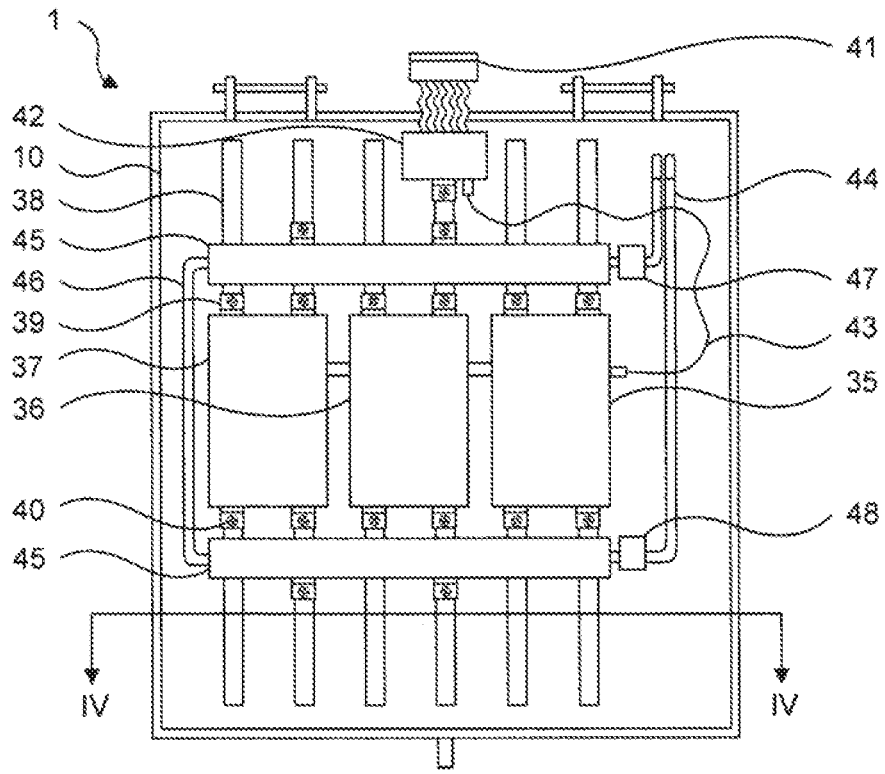
FIG. 3 is an underside view of the cover shown in FIG. 1.
Figure 4:
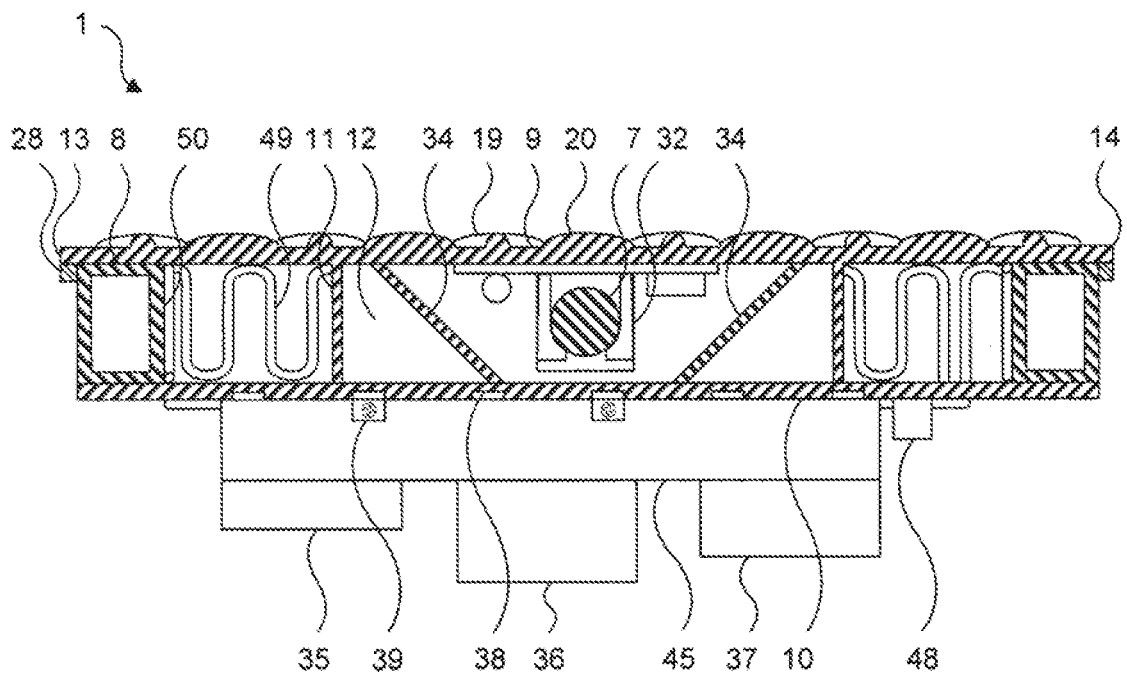
FIG. 4 is a cross-sectional front view of the cover shown in FIG. 1.

Referring to FIGS. 2 and 4, the cover 1 comprises the internal chamber 12, in which the antenna 7 is mounted. In fact, a PCB 30 is mounted in the chamber 12, on which is mounted the antenna 7 for both power and communications purposes. The PCB 30 comprises controlling electronics for the antenna 7, including a programmed control chip 31 which controls its functions. Clips 32 are also provided in the chamber 12 to retain the main rod section 33 of the antenna 7.

Arranged either side of the antenna 7 in the chamber 12 are two radio frequency reflector plates 34. These are constructed from a metal which is impenetrable to radio waves, and they are approximately the same length as the main rod section 33 of the antenna 7. As shown in FIG. 4 the plates 34 are arranged at about 45 degrees to the upper panel 9. As such, the plates 34 are shaped and positioned such that when the cover 1 is in the closed position they reflect radio wave signals transmitted by the antenna 7 in directions towards the internal area 6 of the inspection chamber 2 directly back out of the top 4 of the inspection chamber 2 and into an area beyond. This improves the radiation distribution of the antenna 7 in use, because a strong signal is transmitted out of the cover 1.

The cover 1 also comprises further power and communications devices which facilitate the transmission and reception of radio waves by the antenna 7. In this illustrative example, these comprise an RF transmitter 35, a power supply 36 and a communications data to RF converter 37. The communications data to RF converter 37 taps into the passing optical fibre communications lines and demodulates the optical signal in preparation for its transmission. The demodulated signal then passed to the RF transmitter 35 which converts it into an RF signal for transmission by the antenna 7. As is clear from the Figures, these are fairly large components, and as such they are mounted to an external side of the lower panel 10. It is widely known how such electrical components function to drive an antenna and to transmit and receive multiple communications signals, so this electrical componentry is not described herein in any great detail. The relevant feature here is that these components are mounted to the cover 1.

The lower panel 10 comprises a plurality of tracks 38, to which the RF transmitter 35, power supply 36 and communications data to RF converter 37 are mounted by means of sliding L-brackets 39. The L-brackets 39 are secured in place by screws 40, and they affix to the components on the cover 1 using lateral screws. Such a component mounting arrangement is generally known, and is convenient because the L-brackets 39 can be released for movement to any position on the tracks 38 before being secured in place. This allows for components of any size to be mounted in any convenient location on the lower panel 10.

A power and communications connector 41 is provided for connecting the PCB 30, as well as the RF transmitter 35, power supply 36 and communications data to RF converter 37 to power and communications feeds from within the inspection chamber 2. It extends from a junction box 42 located adjacent the rear section 15 of the frame 8, to which the RF transmitter 35, power supply 36 and communications data to RF converter 37 are connected by cable 43. (The PCB 30 is connected to the junction box 42 via a suitable connector passing through the lower panel 10. This also facilitates its connections to the RF transmitter 35, power supply 36 and communications data to RF converter 37.) As such, the connector 41 is generally in the vicinity of the axis of rotation of the first parts of hinges 3, and is not affected by the rotational position of the cover 1, as shown in FIG. 5.

The cover also comprises heatsink apparatus comprising a closed loop fluid heat exchange system 44 comprising two heat exchangers 45 arranged on the tracks 38 either side of the RF transmitter 35, power supply 36 and communications data to RF converter 37. These are a known kind of heat exchanger which comprises a plurality of heat exchange fins. The heat exchangers are connected via pipes 46 to a fluid pump 47 and a fluid expansion vessel 48. The fluid pump 47 pumps the coolant fluid through the heat exchangers 45 where it absorbs heat emitted by the RF transmitter 35, power supply 36 and communications data to RF converter 37. The fluid is then directed through the lower panel 10 and into flexible pipework 49 arranged along the internal side 50 of the metal box frame 8. As is clear from FIG. 4, the flexible pipework 49 is arranged in a closely packed undulating configuration to maximise the contact area between itself and the metal box frame 8. As the coolant fluid passes along the flexible pipework 49 it transfers its heat to the metal box frame 8, which therefore acts as a heatsink. In use it transfers heat to the metal upper frame part 27, which then transfers it into the ground 51, as explained further below.

The upper panel 9 and the lower panel 10 are constructed from moulded pieces of PTFE. As this is transparent to radio waves, those transmitted and received by the antenna 7 pass freely through the upper panel 8 and out of the inspection chamber 2.

The PC 30 also includes physical parameter sensors 62, which in this illustrative example are temperature and motion detection sensors. These sensors 52 gather data on the ambient temperature inside the enclosure 2 and any movement of the cover 1. This data is transmitted by the programmed control chip 31 via the connector 41 and the communications lines to which it is connected to a remote diagnostics function. In the event of such data indicating an undesired physical situation, remedial action can be taken. This could include data indicating that the cover 1 is in the open position when it should not be, that the cover has collapsed into the enclosure 2, or that the temperature in the cover 1 is too high or too low.

The cover 1 operates as follows. Referring to FIG. 5, this shows a cross-sectional side view of existing power and communications lines inspection chamber 2 which is sunken into the ground 5, with the cross-section being between a side of the cover 1 and a side of the inspection chamber 2. In this illustrative example the cover 1 is a retro-fit replacement for the original hinged cover (not shown) of the inspection chamber 2. This inspection chamber 2 comprises brick side wars 53 which are built upon a concrete base 54, and which define the internal area 6. The metal upper frame part 27 is mounted on the brick side walls 53, and defines the rectangular open top 4 of the inspection chamber 2.

Therefore, the user first removes the original cover, and then mounts the cover 1 in place. The first parts of hinges 3 are applied to second parts of hinges 18, so as to form actual hinges 55. The cover 1 can then be manually moved between the open position shown in FIG. 4 and a closed position (like that shown in FIG. 6) using the handle 21 or the access apertures 24.

The connector 41 is then connected to interface componentry 56 connected to the power and communications lines 57 passing through the inspection chamber 2, by means of its own connector 58. The interface componentry 56 may need to be fitted by the installation engineer, or it may already be present in the inspection chamber 2. Therefore, the various electrical componentry incorporated in or on the cover 1 is powered by power drawn from the lines 57, as well as being connected for communications purposes. The various electrical componentry incorporated in or on the cover 1 then operates according to its programming to transmit and receive radio frequency signals via the antenna 7. The kind of radio frequency signals can be determined by the installation engineer, but they are likely to be either lower frequency mobile network signals or higher frequency WiFi (RIM) signals or the depending on the installation requirements. Again, the manner in which the various electrical componentry incorporated in or on the cover 1 functions is known. Collectively it comprises a functional underground base station.

Once the installation is complete the cover 1 is moved into its closed position. When this happens the seal 28 is applied to the rim 29 of the metal upper frame part 27 to provide a fluid seal to prevent the ingress of water and other environmental elements into the inspection chamber 2. Suitable plugs (not shown) for the access apertures 24 can be provided to close them. The cover 1 can then be locked using the lock 25, to prevent the cover 1 from being opened.

When the antenna 1 operates in use it transmits radio frequency signals omnidirectionally. The parts of the signals which are directed out of the top 4 of the inspection chamber 2 travel directly out into the area around it. A significant proportion of the parts of the signals which are directed towards the internal area 6 of the inspection chamber 2 encounter the reflector plates 34, and are reflected back out of the top 4 of the inspection chamber 2. This improves the radiation distribution of the antenna 7 in use, because a strong signal is transmitted out of the cover 1.

The heatsink apparatus 44 acts in the known way to dissipate heat generated in use. Namely, the fluid pump 47 pumps the coolant fluid through the heat exchangers 45 where it absorbs heat emitted by the RF transmitter 35, power supply 36 and communications data to RF converter 37. The fluid is then directed through the lower panel 10 and into the flexible pipework 49 arranged along the internal side 50 of the metal box frame 8. As the coolant fluid passes along the flexible pipework 49 it transfers its heat to the metal box frame 8, which acts as a heatsink. It transfers heat to the metal upper frame part 27, which then transfers it into the ground 5.

The physical parameter sensors 52 operate the known way to detect temperature and movement. Pedestrians or vehicles which pass over the cover 1 in use are prevented from slipping by the anti-slip formations 19.

In the event that any remedial work is required an engineer can return to the inspection chamber 2 to perform it. They can unlock the lock 25, and then lift the cover 1 into the open position as shown in FIG. 4 using the handle 21. They can then access all the components mounted to the lower panel 10 and can readily remove them for replacement or repair. If they need to access the internal chamber 12 they can remove the lower panel 10 from the box frame 8 to gain access. They can also access the power and communications ones 57, the interface componentry 56 and any other standard components contained in the inspection chamber 2, as normal.

The second aspect of the present invention relates to an enclosure for mounting in a surface in a sunken arrangement. It will be appreciated from FIG. 5 how this can be achieved. In particular, rather than being an existing inspection chamber 2, it could instead be originally constructed with the cover 1. This could take the form of being constructed off-site as a complete unit and then being placed in the ground 5, or it could take the form of being constructed on-site by an installation engineer. They could dig a hole in the ground 5, place the concrete base 54 therein and then build the brick side walls 53, before adding the metal upper frame part 27 and the cover 1.

A further alternative is possible which is shown in FIG. 6. In this case sunken enclosure 59 is similar to inspection chamber 2, but it is shallower and does not comprise any power and communications lines passing through it. Instead, it is intended to be used alongside such an inspection chamber, and is appropriate in instances in which it is desired to connect a cover like cover 1 described above to ground laid power and communications lines passing through a particular inspection chamber, but for some reason it is not possible to fit the cover 1 to that existing inspection chamber. This might happen if the inspection chamber in question lacks sufficient space to accommodate the antenna or other components. The enclosure 59 can therefore be fitted adjacent to the existing inspection chamber, with power and communications connections passing from the existing inspection chamber into the enclosure 59.

Therefore, enclosure 59 comprises an internal area 60, an open top 61 and a cover 62. As previously, the cover 62 is movable between a closed position, as shown in FIG. 6 in which it closes the open top 61 and is substantially level with the ground 63, and an open position in which it is displaced from the ground and exposes the internal area 60 (in the manner shown in FIG. 5). Although it is not visible in FIG. 6, the cover 62 comprises an antenna for transmitting and receiving radio waves.

The cover 62 is similar to cover 1 described above. In particular, it comprises further power and/or communications devices 64, which are mounted to the lower panel 65 as above. The cover 62 is similarly connected to interface componentry 66 provided in the internal area 60 by means of connector 67. The interface componentry 66 is connected to power and communications lines passing through an adjacent inspection chamber (not visible) by cables 68, which pass through ducts 69 provided in the brick side walls 70.

Figure 8:
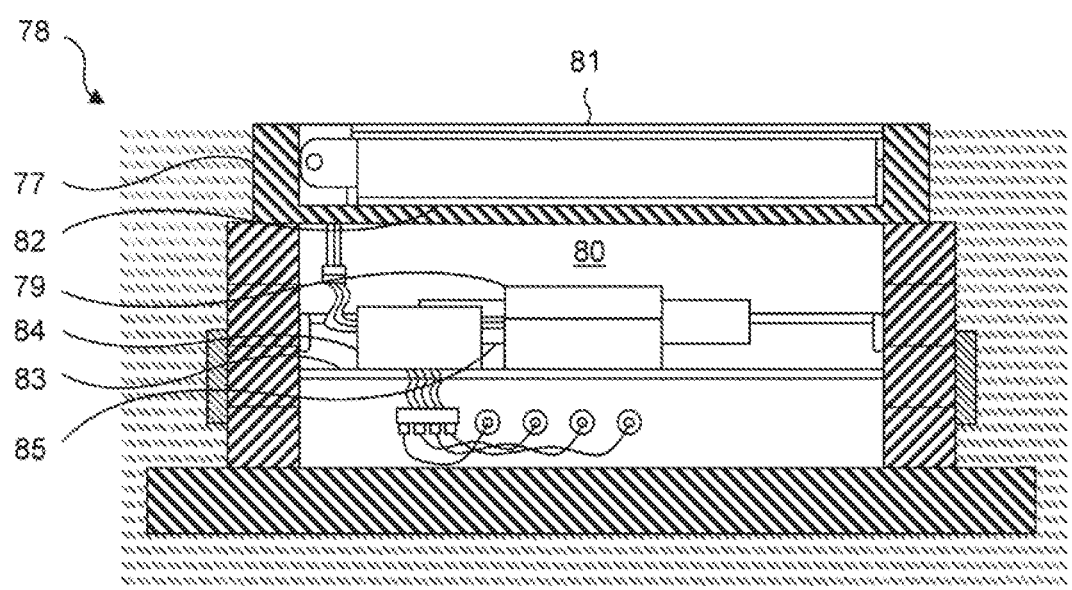
FIG. 8 is a cross-sectional side view of second enclosure according to the second aspect of the present invention.

One important difference is that the heatsink apparatus is provided in the enclosure 2 as opposed to being provided on the cover 62. In particular, the heatsink apparatus comprises a closed loop fluid heat exchange system 71 comprising two heat exchangers 72 (only one of which is visible in FIG. 6) mounted to the brick side walls 70, such that they are in the vicinity of the further power and/or communications devices 64 when the cover 62 is in the closed position. A fluid pump 73 pumps coolant fluid through the heat exchangers 72 where it absorbs heat emitted by the further power and/or communications devices 64 in use. The fluid is then directed via pipes 74 through the brick side walls 70 and into direct contact with a metal cold plate 75 disposed around the outside of the brick side walls 70. This therefore acts as a heatsink, which transfers heat directly into the ground 63. This heat exchange system 71 is more efficient than heat exchange system 44 described above, because the cold plate 75 has much greater heatsink properties than the metal box frame 8. However, it will be appreciated that heat exchange system 71 is only possible where the enclosure 59 is constructed with it in mind, which is not the case with existing inspection chambers In other respects the enclosure 59 is similar to inspection chamber 2. In particular it also has concrete base 76 which supports the brick side walls 70, and a metal upper frame part 77 mounted on the brick side walls 70, which is the same as upper metal frame part 27 described above in that it supports the cover 62 for rotation and locking in the In one further embodiment shown in FIG. 8, enclosure 78 is similar to enclosure 59 described above, except that in this case the further power and/or communications devices 79 are all mounted in the internal area 80. As such, the cover 81 does not carry them on its lower panel 82 and therefore only has the antenna (not visible) therein. The further power and/or communications devices 79 are mounted on a platform 83 next to the interface componentry 84. The heat exchangers 85 are lower than in enclosure 59, so as to be in the closest vicinity of the further power and communications devices 79.

The present invention can be further altered without departing from the scope of claim 1. For example, in one alternative embodiments (not shown) the antenna is a bespoke item constructed specifically for use with the cover, rather than having the simplex rod shape of antenna 7. In other alternative embodiments (not shown) the antenna is U-shaped, lattice shapes and matrix shapes. In other embodiments (not shown) it is three dimensional and extends in multiple planes.

In another alternative embodiment (not shown) a cover is like cover 1, but instead of first parts of hinges, it simply comprises a flange for mounting on a ledge provided in the inspection chamber. In other words, the cover is completely removable from the inspection chamber by simply being lifted from the ledge.

In one further alternative embodiment (no shown) an enclosure like enclosures 59 of 78 is constructed entirely from concrete off-site, for placement in a hole dug on site.

Therefore, the present invention provides a convenient and efficient way to increase the capacity of communications networks. In an urban environment covers of the invention can be dispersed at intervals over a wide area, providing comprehensive street level wireless communications. The invention is also very easy to fit, given that power and communications lines inspection chambers already exist, and it is a relatively simple matter to replace their covers with those of the invention. The manner in which the antennas function and are programmed to operate can be according to known techniques so there is no additional technical burden required to put the invention into effect. Further, as the covers are in such close proximity to the power and communications lines they require to function, it is easy to connect them up.

The invention claimed is:

1. A cover for a sunken enclosure, in which said cover comprises a mounting part for mounting said cover to a sunken enclosure with which said cover is used such that said cover is movable between a closed position in which said cover closes an open top of said enclosure and is substantially level with a surface intersected by said open top, and an open position in which said cover is displaced from said surface and exposes an internal area of said enclosure, and in which said cover comprises:

an antenna for transmitting and receiving radio waves and for connecting to further power and/or communications facilitate transmission and reception of radio waves by said antenna; and a heatsink apparatus for dissipating heat from the further power and/or communications devices, wherein the heatsink apparatus comprises a closed loop fluid heat exchange system, the closed loop fluid heat exchange system comprising one or more heat exchangers for positioning in the vicinity of the further power and/or communications devices, wherein said heatsink apparatus further comprises pipework in thermal communication with a metal outer frame of said cover, and a fluid pump for pumping fluid through said heat exchangers and through said pipework.

2. A cover as claimed in claim 1 in which said cover comprises an internal chamber, and in which said antenna is mounted in said internal chamber.

3. A cover as claimed in claim 2 in which an upper panel and a lower panel which define said internal chamber between them are mounted to said metal outer frame, and in which at least said upper panel is transparent to radio waves.

4. A cover as claimed in claim 3 in which said cover comprises radio frequency reflector plates which are shaped and/or positioned such that when said cover is in said closed position said radio frequency reflector plates direct portions of the radio wave signals which transmitted by said antenna in directions towards said internal area back out of said top of said enclosure and into an area beyond said enclosure.

5. A cover as claimed in claim 4 in which said mounting part comprises the first part of a hinge for mounting to a second part of said hinge provided as a part of said enclosure, and in which said cover rotates about a hinge axis when said cover moves between said closed position and said open position.

6. A cover as claimed in claim 3 in which said cover comprises the further power and/or communications devices, said devices being one or more of a programmed control chip, an RF transmitter, a power connector, a power supply, a communication line connector, an in-line data communication converter and a communications data to RF converter.

7. A cover as claimed in claim 6 in which said lower panel comprises the first part of an attachment mechanism on an external side thereof, and in which said further power and/or communications devices are attached to said lower panel by the second part of said attachment mechanism.

8. A cover as claimed in claim 6 in which said cover comprises a power and/or communications connector for connecting one or more of said antenna, said programmed control chip, said RF transmitter, said power connector, said power supply, said communication line connector and said communications data to RF converter to power and/or communications equipment with which said cover is used and which is disposed in said enclosure.

9. A cover as claimed in claim 3 in which said upper panel comprises anti-slip formations on an external side thereof.

10. A cover as claimed in claim 3 in which said upper panel comprises a handle on an external side thereof which is moveable between a flush position in which said handle is level with a plane of said external side of said upper panel, and a raised position in which said handle is usable to manipulate said cover.

11. A cover as claimed in claim 1 in which said cover further comprises one or more physical parameter sensors being one or more of temperature, humidity, motion detection, electrical fault or water ingress, pressure, footfall counter, GPS antenna and RFID tag sensors.

12. A cover as claimed in claim 1 in which said cover comprises a locking part for locking said cover in said closed position.

13. A cover as claimed in claim 1 in which said cover comprises a seal member around a periphery thereof which engages a rim of said open top in said closed position to fluidly seal said internal area.

14. An enclosure for mounting in a surface in a sunken arrangement comprising an internal area, an open top and a cover, in which said cover is movable between a closed position in which said cover closes said open top and is substantially level with said surface, and an open position in which said cover is displaced from said surface and exposes said internal area, and in which said cover comprises an antenna for transmitting and receiving radio waves, in which said enclosure comprises further power and/or communications devices that facilitate transmission and reception of radio waves by said antenna, and a heat sink apparatus for dissipating heat from the further power and/or communications devices, wherein the heat sink apparatus comprises a closed loop fluid heat exchange system, the closed loop fluid heat exchange system comprising one or more heat exchangers for positioning in the vicinity of the further power and/or communications devices, wherein said heatsink apparatus further comprises a cold plate for mounting to an external side of said enclosure and a fluid pump for pumping fluid through said heat exchangers and into thermal communication with said cold plate.

\* \* \* \* \*